US010453549B2

(12) United States Patent
Lee et al.

(10) Patent No.: US 10,453,549 B2
(45) Date of Patent: Oct. 22, 2019

(54) MEMORY DEVICE INCLUDING VIRTUAL FAIL GENERATOR AND MEMORY CELL REPAIR METHOD THEREOF

(71) Applicant: SAMSUNG ELECTRONICS CO., LTD., Suwon-si (KR)

(72) Inventors: Kwang-Won Lee, Hwaseong-si (KR); InCheol Nam, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 15/794,150

(22) Filed: Oct. 26, 2017

(65) Prior Publication Data

US 2018/0166150 A1 Jun. 14, 2018

(30) Foreign Application Priority Data

Dec. 8, 2016 (KR) .......................... 10-2016-0166902

(51) Int. Cl.
*G11C 29/44* (2006.01)
*G11C 29/12* (2006.01)
*G11C 29/00* (2006.01)
*G06F 12/08* (2016.01)

(52) U.S. Cl.
CPC .......... *G11C 29/4401* (2013.01); *G06F 12/08* (2013.01); *G11C 29/00* (2013.01); *G11C 29/12* (2013.01); *G11C 29/44* (2013.01); *G11C 29/76* (2013.01); *G11C 2029/4402* (2013.01)

(58) Field of Classification Search
CPC ..... G11C 29/4401; G11C 29/00; G11C 29/12; G11C 29/44; G11C 29/76; G11C 2029/4402; G06F 12/08
See application file for complete search history.

(56) References Cited

U.S. PATENT DOCUMENTS

| 5,764,576 A * | 6/1998 | Hidaka | G11C 29/24 365/200 |
| 6,067,259 A * | 5/2000 | Handa | G11C 29/808 365/200 |
| 6,480,978 B1 | 11/2002 | Roy et al. | |
| 6,580,644 B1 * | 6/2003 | Chung | G11C 16/30 365/185.09 |
| 7,266,735 B2 | 9/2007 | Hirabayashi | |

(Continued)

FOREIGN PATENT DOCUMENTS

| JP | 3576978 B2 | 10/2004 |
| JP | 3741895 B2 | 2/2006 |
| JP | 2008-217848 A | 9/2008 |

*Primary Examiner* — Kyle Vallecillo
(74) *Attorney, Agent, or Firm* — Sughrue Mion, PLLC

(57) ABSTRACT

A memory device includes a memory cell array, a comparator, and a virtual fail generator. The memory cell array includes memory cells. The comparator determines whether a fail of a first memory cell of the memory cell array corresponding to a first address is generated, by comparing data stored in the first memory cell with an expected value. The virtual fail generator generates a second address based on the first address provided from the comparator, in response to the comparator determining that the fail of the first memory cell is generated. The first memory cell and a second memory cell corresponding to the second address are repaired by spare memory cells in response to a repair command.

20 Claims, 14 Drawing Sheets

(56) References Cited

U.S. PATENT DOCUMENTS

| | | |
|---|---|---|
| 7,669,095 B2 | 2/2010 | Clark et al. |
| 7,719,914 B2 | 5/2010 | Kobayashi |
| 7,865,788 B2 | 1/2011 | Burlison et al. |
| 8,381,052 B2 | 2/2013 | Chickanosky et al. |
| 8,599,632 B2 | 12/2013 | Anzou et al. |
| 8,615,691 B2 | 12/2013 | Dokken et al. |
| 8,621,305 B2 | 12/2013 | Bock et al. |
| 9,036,439 B2 | 5/2015 | Kim et al. |
| 9,201,748 B2 | 12/2015 | Morris et al. |
| 9,343,185 B2 | 5/2016 | Barth, Jr. et al. |
| 2003/0065996 A1 | 4/2003 | Shimada et al. |
| 2003/0236648 A1* | 12/2003 | Yasui ............... G11C 29/56 702/185 |
| 2004/0213058 A1* | 10/2004 | Shimizu ............... G11C 29/44 365/200 |
| 2005/0086572 A1 | 4/2005 | Hirabayashi |
| 2006/0069528 A9* | 3/2006 | Akutsu ............... B82Y 15/00 702/185 |
| 2007/0208977 A1 | 9/2007 | Clark et al. |
| 2008/0091981 A1 | 4/2008 | Dokken et al. |
| 2009/0027982 A1 | 1/2009 | Kobayashi |
| 2009/0132870 A1 | 5/2009 | Burlison et al. |
| 2010/0251043 A1 | 9/2010 | Anzou et al. |
| 2011/0113280 A1 | 5/2011 | Chickanosky et al. |
| 2012/0011403 A1 | 1/2012 | Bock et al. |
| 2013/0016574 A1 | 1/2013 | Kim et al. |
| 2013/0070545 A1 | 3/2013 | Anzou et al. |
| 2013/0311821 A1 | 11/2013 | Morris et al. |
| 2013/0311831 A1 | 11/2013 | Oh et al. |
| 2015/0089329 A1 | 3/2015 | Barth, Jr. et al. |
| 2016/0093401 A1 | 3/2016 | Chang et al. |
| 2017/0293514 A1* | 10/2017 | Cadigan ............... G06F 11/076 |

* cited by examiner

MEMORY DEVICE INCLUDING VIRTUAL FAIL GENERATOR AND MEMORY CELL REPAIR METHOD THEREOF

CROSS-REFERENCE TO RELATED APPLICATIONS

This Application claims priority from Korean Patent Application No. 10-2016-0166902, filed Dec. 8, 2016 in the Korean Intellectual Property Office, the entire contents of which are hereby incorporated by reference.

BACKGROUND

1. Field

Apparatuses and methods consistent with example embodiments relate to a semiconductor memory device, and in particular, to a memory device including a virtual fail generator and a memory cell repair method thereof.

2. Description of the Related Art

Memory devices are being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. The consumer's demand for the memory device diversifies as the memory device is used as a storage medium in various devices. As such, a high-capacity memory device is being developed.

To this end, a nanofabrication technology for increasing a capacity of the memory device has been studying continuously. Meanwhile, as the nanofabrication technology is developed, an unexpected defect generated in a manufacturing process is increasing. Also, the number of fail cells, in which data writing and reading operations are not performed normally due to the defect, is gradually increasing. A memory device may include spare memory cells for replacing the fail cells.

Memory cells may have sensing margins of various levels distributed within a given range. Accordingly, in the case where a memory cell directly or indirectly affected by the fail cells has a relatively better sensing margin than that of the fail cell, the corresponding memory cell is not detected as a fail cell during a test operation. In addition, the memory cell may cause an error during an operation of the memory device.

SUMMARY

One or more example embodiments provide a memory device including a virtual fail generator and a memory cell repair method thereof.

According to an aspect of an example embodiment, a memory device includes a memory cell array including memory cells; a comparator configured to determine whether a fail of a first memory cell from among the memory cells is generated, by comparing data stored in the first memory cell with an expected value, the first memory cell corresponding to a first address; and a virtual fail generator configured to, in response to the comparator determining that the fail of the first memory cell is generated, generate a second address based on the first address provided from the comparator, wherein the memory device is configured to repair the first memory cell and a second memory cell from among the memory cells using spare memory cells from among the memory cells in response to a repair command, the second memory cell corresponding to the second address.

According to an aspect of an example embodiment, a memory cell repair method of a memory device including a memory cell array includes reading data for verifying whether fails of memory cells included in the memory cell array are generated, from a first memory cell of the memory cells, the first memory cell corresponding to a first address; determining, at a comparator of the memory device, whether a fail of the first memory cell is generated, by comparing the data that is read with an expected value; and generating, at a virtual fail generator of the memory device in response to determining that the fail of the first memory cell is generated, a second address which is based on the first address provided from the comparator.

According to an aspect of another example embodiment, a memory device includes a memory cell array comprising memory cells; a comparator configured to determine whether a fail of a first memory cell from among the memory cells is generated, by comparing data stored in the first memory cell with an expected value, the first memory cell corresponding to a first address; a virtual fail generator configured to generate a second address based on the first address provided from the comparator, in response to the comparator determining that the fail of the first memory cell is generated; and a fail address store circuit comprising fuse sets for storing the first address and the second address, wherein the first memory cell corresponding to the first address stored in the fail address store circuit and a second memory cell corresponding to the second address stored in the fail address store circuit are repaired by spare memory cells.

According to an aspect of another example embodiment, a memory device includes a memory cell array comprising memory cells and spare memory cells; a circuit configured to determine a first address of a first memory cell that has failed from among the memory cells; a virtual fail generator configured to receive the first address from the circuit and generate a second address of a second memory cell from among the memory cells that is expected to fail based on the first address; and a repair circuit that repairs the first memory cell and the second memory cell with the spare memory cells in response to a repair command.

BRIEF DESCRIPTION OF THE DRAWINGS

The above and other aspects will become apparent from the following description of example embodiments, with reference to the accompanying drawings in which.

DETAILED DESCRIPTION

Below, example embodiments will be described in detail.

Figure 1:
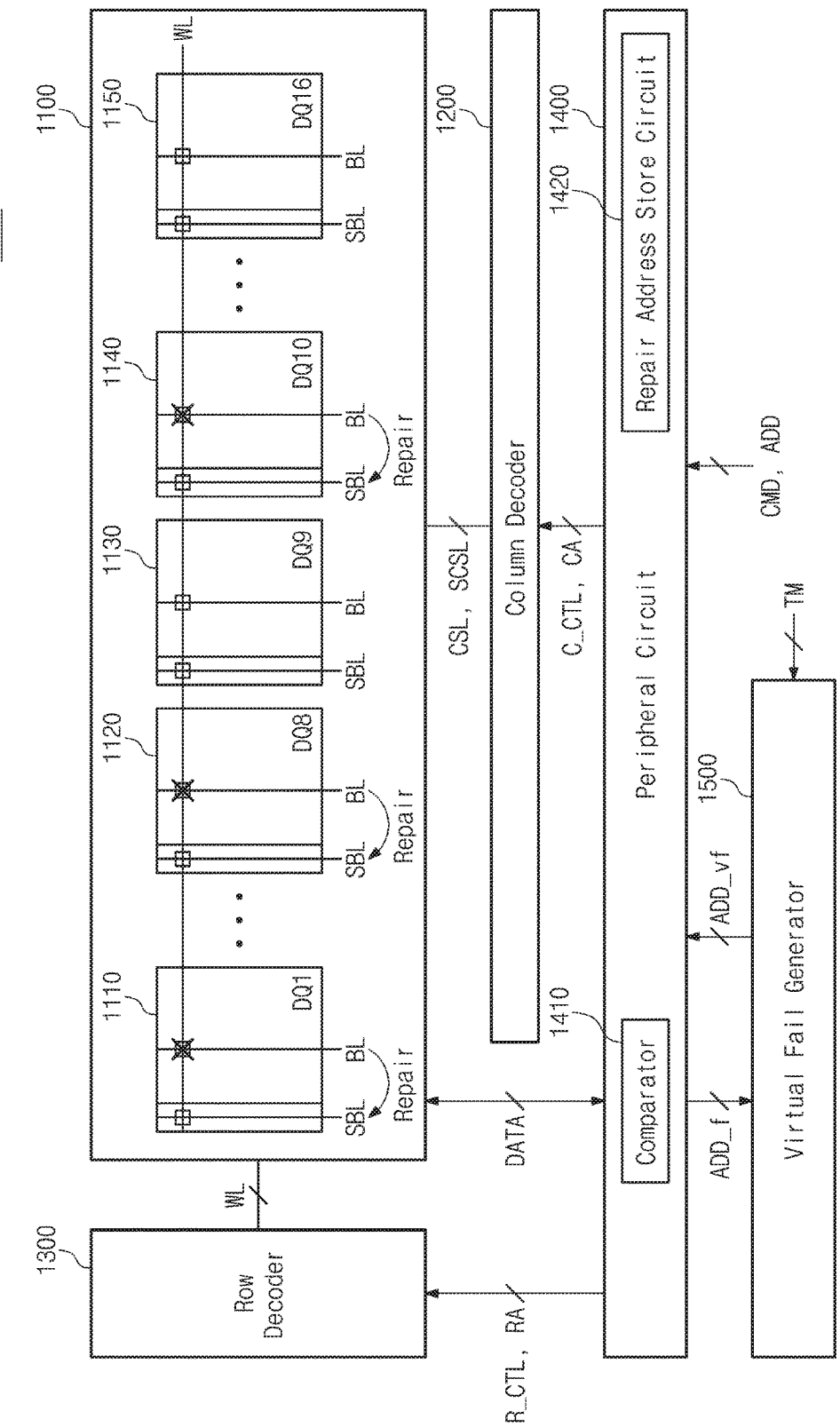
FIG. 1 is a block diagram illustrating a memory device according to an example embodiment.

FIG. 1 is a block diagram illustrating a memory device according to an example embodiment. Referring to FIG. 1, a memory device 1000 may include a memory cell array 1100, a column decoder 1200, a row decoder 1300, a peripheral circuit 1400, and a virtual fail generator 1500.

The memory cell array 1100 may include first to sixteenth mats 1110 to 1150. The first to sixteenth mats 1110 to 1150 may include the same configuration. For ease of description, one bit line BL, one spare bit line SBL, and one word line WL are illustrated in the first to sixteenth mats 1110 to 1150. As illustrated in FIG. 1, the first to sixteenth mats 1110 to 1150 share the word line WL, but the bit line BL and the spare bit line SBL in each of the first to sixteenth mats 1110 to 1150 are not shared. A detailed configuration of each of the first to sixteenth mats 1110 to 1150 will be described with reference to FIG. 2.

In the first mat 1110, data of a memory cell connected to the word line WL and the corresponding bit line BL may be provided from or output to the outside (e.g., a host) through a first input/output pad (not illustrated) of the peripheral circuit 1400. Likewise, in each of the second to sixteenth mats 1120 to 1150, data of a memory cell connected to the word line WL and the corresponding bit line BL may be provided from or output to the outside (e.g., a host) through the corresponding one of second to sixteenth input/output pads (not illustrated) of the peripheral circuit 1400. However, a relationship between a mat and an input/output pad and the numbers of mats and input/output pads are not limited to of the example shown in FIG. 1.

Figure 2:
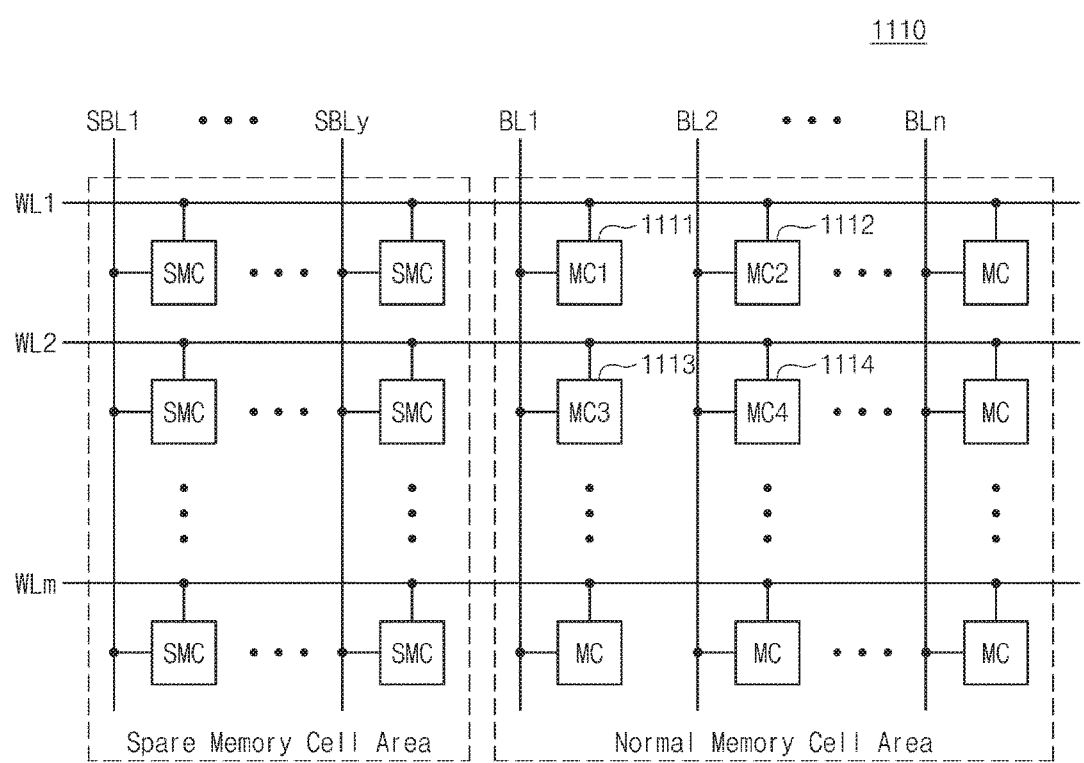
FIG. 2 is a drawing illustrating a first mat of the memory device illustrated in FIG. 1.

When a fail memory cell generated in a manufacturing process is detected in a process of testing the memory device 1000, the detected memory cell may be replaced with a spare memory cell. Below, a memory cell in which a fail is generated is referred to as a "fail cell". A process of replacing a fail cell with a spare memory cell is referred to as "repair". For example, the repair may include row repair and/or column repair based on a repair scheme. The row repair is used to replace a row address corresponding to a word line, to which a fail cell is connected, with a row address of a spare memory cell. To perform the row repair, the memory cell array 1100 may include a spare memory cell connected to a spare word line. A configuration of the memory device 1000 that performs the column repair is illustrated in FIGS. 1 and 2. However, this is only an example. The memory device 1000 may be configured to perform the row repair.

The column repair is used to replace a column address corresponding to a bit line, to which a fail cell is connected, with a column address of a spare memory cell. To perform the column repair, the memory cell array 1100 may include a spare memory cell connected to a spare bit line. For example, when a fail cell is detected in the first mat 1110 of the memory device 1000 performing the column repair, the bit line BL connected to the fail cell is replaced with the spare bit line SBL. Afterwards, when the memory device 1000 receives a write command or a read command of a column address corresponding to the bit line BL, the spare bit line SBL may be activated. The column repair will be more fully described with reference to FIG. 2.

For example, the column repair may perform repair in units of two or more columns, and the row repair may also perform repair in units of two or more rows. For ease of description, below, it is assumed that the repair is performed in units of a column or a row.

The memory device 1000 may receive an activate command before receiving the read command or the write command from the outside. For example, the memory device 1000 may receive an activate command from an external test circuit. A plurality of memory cells, which are connected to the word line WL corresponding to a row address received according to the activate command, may be selected. Afterwards, when the memory device 1000 receives the write command or the read command, the bit line BL corresponding to a column address provided together with the write command or the read command may be selected and activated. Then, the memory device 1000 may write data in a memory cell corresponding to the received row and column addresses or may read data from the memory cell.

The column decoder 1200 may be connected with the memory cell array 1100 through a column select line CSL and a spare column select line SCSL. The column decoder 1200 may be provided with a column control signal C CTL and a column address CA from the peripheral circuit 1400. The column decoder 1200 decodes the column address CA and selects the column select line CSL or the spare column select line SCSL of the memory cell array 1100, which corresponds to the decoded address. The column decoder 1200 may activate any bit line BL or any spare bit line SBL of the first to sixteenth mats 1110 to 1150 through the selected column select line CSL or the spare column select line SCSL. Although not illustrated in FIG. 1, in the case where the memory device 1000 performs the column repair, the column decoder 1200 may include a column address comparator (not illustrated) (to be described in FIG. 15).

The row decoder 1300 may be connected with the memory cell array 1100 through the word line WL. The row decoder 1300 may be provided with a row control signal R_CTL and a row address RA from the peripheral circuit 1400. The row decoder 1300 may decode the row address RA and may activate the word line WL corresponding to the decoded row address RA. Although not illustrated in FIG. 1, in the case where the memory device 1000 performs the row repair, the row decoder 1300 may include a row address comparator (not illustrated) (to be described in FIG. 16).

The peripheral circuit 1400 may be provided with a command CMD and an address ADD_from a host (not illustrated). A command decoder (not illustrated) of the peripheral circuit 1400 decodes the command CMD. The peripheral circuit 1400 provides the column decoder 1200 with the decoded column control signal C_CTL and the column address CA included in the address ADD. The peripheral circuit 1400 provides the row decoder 1300 with the decoded row control signal R_CTL and the row address RA included in the address ADD. On the basis of the provided command CMD and the provided address ADD, the peripheral circuit 1400 may write test data for evaluating whether a fail of a memory cell is generated, in a memory cell corresponding to the address ADD.

The peripheral circuit 1400 may include a comparator 1410 and a repair address store circuit 1420. The comparator 1410 reads the test data stored in the memory cell of the memory cell array 1100 corresponding to the written test data and determines whether a fail of the corresponding memory cell is generated, by comparing the read data with reference data. The comparator 1410 provides an address of a fail cell to the virtual fail generator 1500. Below, the address of the fail cell is referred to as a "fail address ADD_f".

The repair address store circuit 1420 stores the fail address ADD_f. The repair address store circuit 1420 stores a virtual fail address ADD_vf provided from the virtual fail generator 1500. For example, the repair address store circuit 1420 may include a laser fuse, an anti-fuse, or an electrical fuse (E-fuse). The laser fuse refers to a fuse that is cut at a wafer level before packaging the memory device 1000. The anti-fuse may include a metal oxide semiconductor field effect transistor (MOSFET) including a thin gate oxide. The E-fuse refers to a fuse that is cut by the large amount of current instantly flowing through the E-fuse. The E-fuse can be cut even after packaging, and thus, the E-fuse may be easy to use compared with the laser fuse.

The repair address store circuit 1420 may cut the above-described fuse to store the fail address ADD_f and the virtual fail address ADD_vf. The repair address store circuit 1420 may semi-permanently store a fail address through the cut fuse.

The virtual fail generator 1500 is provided with the fail address ADD_f from the peripheral circuit 1400. The virtual fail generator 1500 may be provided with a test mode signal TM from the outside. For example, the test mode signal TM may be provided rom an external test circuit. The virtual fail generator 1500 generates the virtual fail address ADD_vf based on the fail address ADD_f, in response to the test mode signal TM. The virtual fail address ADD_vf refers to an address of a memory cell of a potential fail, not a memory cell in which a fail is actually generated. That is, the virtual fail address ADD_vf refers to an address of a memory cell sharing a fail cause of a fail cell in direct or indirect connection with the fail cell.

The host (not illustrated), a controller, or a user may identify a fail type based on data of a fail address output from the comparator 1410. A potential fail cell may be determined based on the identification result. On the basis of the determination result, the host (not illustrated), the controller, or the user provides the virtual fail generator 1500 with the test mode signal TM for generating an address corresponding to the potential fail cell. The virtual fail generator 1500 generates the virtual fail address ADD_vf in response to the test mode signal TM.

The configuration of the memory device 1000 including the virtual fail generator 1500 to generate the virtual fail address ADD_vf is briefly described above. The memory device 1000 according to an example embodiment generates the virtual fail address ADD_vf based on the fail address ADD_f using the virtual fail generator 1500. That is, the memory device 1000 generates an address of a memory cell, which directly or indirectly shares a fail cause of a fail cell, as the virtual fail address ADD_vf. Through the above-described configuration and operation, the memory device 1000 repairs memory cells corresponding to the fail address ADD_f and the virtual fail address ADD_vf with a spare memory cells. Accordingly, it may be possible to repair a fail cell and a memory cell having a potential fail cause and to prevent a fail of a memory cell, which is generated during an operation of the memory device 1000.

FIG. 2 is a drawing illustrating the first mat of the memory device illustrated in FIG. 1. Referring to FIG. 2, the first mat 1110 may include a normal memory cell area and a spare memory cell area. The normal memory cell area may include a memory cell MC. For example, each memory cell may be a dynamic random access memory (DRAM) cell, a static random access memory (SRAM) cell, or the like. Each memory cell may be a non-volatile memory cell. For example, each memory cell may be a NOR flash memory cell, a NAND flash memory cell, a ferroelectric random access memory (FRAM) cell, a phase change random access memory (PRAM) cell, a thyristor random access memory (TRAM) cell, a magnetic random access memory (MRAM) cell, or the like.

The spare memory cell area may include a spare memory cell SMC. The spare memory cell SMC may be used to replace the memory cell MC. The spare memory cell SMC and the memory cell MC may have the same configuration. When a fail is generated in the memory cell MC, the memory cell MC may be repaired through the spare memory cell SMC. The location of the spare memory cell area with respect to the normal memory cell area is not limited to the example illustrated in FIG. 2. The spare memory cell area may be disposed at any location in the first mat 1110.

In a process of manufacturing a memory cell, an error may occur in the memory cell due to a nanofabrication process. The error may be roughly classified as a hard error or a soft error. The hard error may denote the case where hardware of a memory cell is damaged. The soft error may denote the case where hardware of a memory cell is not damaged but data of the memory cell temporarily transitions due to alpha particles and so on. The hard error may be corrected through the spare memory cell SMC or an error correction operation. The soft error may be corrected through an error correction operation.

Below, a fail of the memory cell denote the hard error. The fail of the memory cell may include various types of fail. An example of a type of fail generated in the memory cell will be described later with reference to first to fourth memory cells 1111 to 1114 illustrated in FIG. 3.

Referring to FIG. 2, the normal memory cell area may be connected with a plurality of word lines WL1 to WLm and a plurality of bit lines BL1 to BLn. The spare memory cell area may be connected with the plurality of word lines WL1 to WLm and a plurality of spare bit lines SBL1 to SBLy. Below, the plurality of spare bit lines are referred to as "column redundancy". Here, "m" and "n" may be determined by characteristics (e.g., capacitance of a bit line and an area), a design specification, etc. For example, "m" may be 384, 512, 640, 767, 832, or 1024, etc., and "n" may be 512, 1024, or 2048, etc. "y" denotes the number of spare bit lines, and "m" denotes the number of word lines. However, an example embodiment is not limited to the above numeric values. Below, a column repair operation will be described.

For example, it is assumed that a fail is generated in memory cells connected to the first bit line BL1. In this case, a bit line connected to a fail cell may be replaced with one of spare bit lines through the column repair operation. When a host (not illustrated) requests a memory device to access the first bit line BL1, the first spare bit line SBL1 may be selected instead of the first bit line BL1. That is, as if the host requests that the memory device accesses the first bit line BL1, the first spare bit line SBL1 may be actually selected instead of the first bit line BL1. The first bit line BL1 may be replaced with any one of the spare bit lines SBL1 to SBLy. As such, if a fail cell occurs, the repair operation may be performed in units of a column, not a memory cell MC.

As described above, example embodiments may be easily applied to the memory device 1000 that includes a row decoder including a row address comparator (not illustrated) and spare word lines to perform the row repair. In the case where the memory device 1000 performs the row repair, the first mat 1110 may further include spare word lines and spare memory cells connected with the spare word lines. A spare word line or a spare bit line may be used according to an error location of the memory cell MC.

Figure 3:
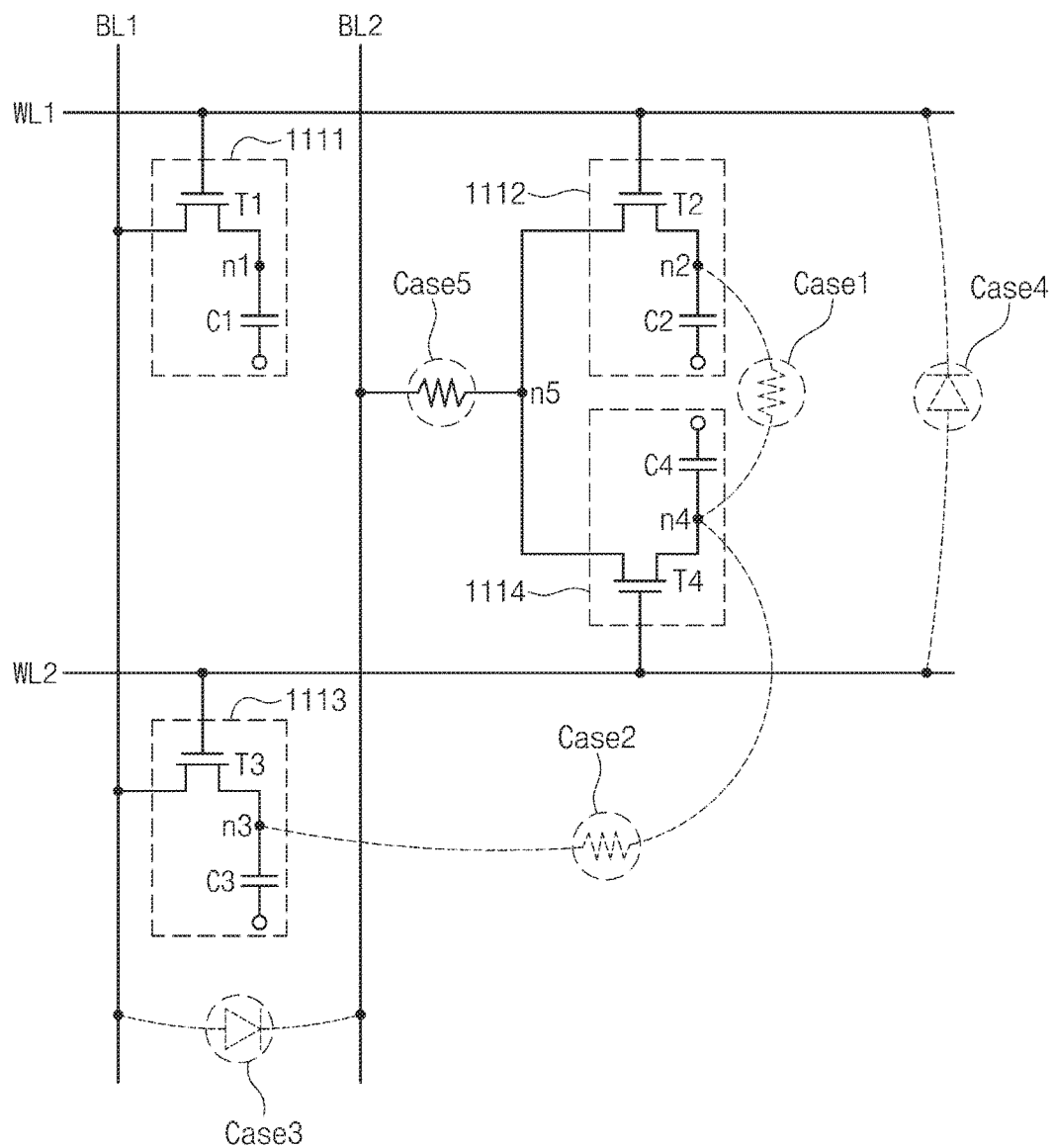
FIG. 3 is a circuit diagram for describing fail cases of first to fourth memory cells of the first mat illustrated in FIG. 2.

FIG. 3 is a circuit diagram for describing fail cases of first to fourth memory cells of the first mat illustrated in FIG. 2. A circuit diagram of FIG. 3 will be described with reference to FIG. 1. First to fourth memory cells 1111 to 1114 are illustrated in FIG. 3. The first to fourth memory cells 1111 to 1114 may include the same configuration.

The first memory cell 1111 includes a transistor T1 and a capacitor C1, and the transistor T1 is connected with the capacitor C1 through a node n1. The second memory cell 1112 includes a transistor T2 and a capacitor C2, and the transistor T2 is connected with the capacitor C2 through a node n2. The third memory cell 1113 includes a transistor T3 and a capacitor C3, and the transistor T3 is connected with the capacitor C3 through a node n3. The fourth memory cell 1114 includes a transistor T4 and a capacitor C4, and the transistor T4 is connected with the capacitor C4 through a node n4.

Gates of the transistors T1 and T2 respectively included in the first and second memory cells 1111 and 1112 are connected to the first word line WL1. Gates of the transistors T3 and T4 respectively included in the third and fourth memory cells 1113 and 1114 are connected to the second word line WL2. Sources of the transistors T1 and T3 respectively included in the first and third memory cells 1111 and 1113 are connected to the first bit line BL1.

Various fail cases may appear in the first to fourth memory cells 1111 to 1114 due to unintended defects generated in a process of manufacturing the memory device 1000. First to fifth fail cases Case1 to Case5 are illustrated in FIG. 3.

In the first fail case Case1, a node n2 of the second memory cell 1112 may be connected with a node n4 of the fourth memory cell 1114 by a parasitic resistor. In an ideal case, the node n2 may be separated from the node n4 by an insulator. As a gap between metal lines decreases due to a miniaturization process, an issue that the node n2 is not perfectly separated from the node n4 may occur. In this case, a fail that the nodes n2 and n4 are indirectly connected to each other through the parasitic resistor may be generated (Case1). The parasitic resistor is provided as an example. Instead of the parasitic resistor, a parasitic diode or a parasitic capacitor may be formed according to a case of a generated defect. Accordingly, in the first to fifth fail cases Case1 to Case5, the parasitic resistor may be replaced with a parasitic diode or a parasitic capacitor. Alternatively, the parasitic diode may be replaced with a parasitic resistor or a parasitic capacitor.

In the second fail case Case2, a node n3 of the third memory cell 1113 may be indirectly connected with the node n4 of the fourth memory cell 1114 by a parasitic resistor while being not perfectly separated from the node n4. In the third fail case Case3, the first bit line BL1 may be indirectly connected with the second bit line BL2 by a parasitic diode while being not perfectly separated from the second bit line BL2. In the fourth fail case Case4, the first word line WL1 may be indirectly connected with the second word line WL2 by a parasitic diode while being not perfectly separated from the second word line WL2. The indirect connections are shown in FIG. 3 using dashed lines.

In the fifth fail case Case5, sources of the transistors T2 and T4 included in the second and fourth memory cells 1112 and 1114 may be connected with the second bit line BL2 through a parasitic resistor. The parasitic resistor of the fifth fail case Case5 may be formed when a contact from the second bit line BL2 to a node n5 is intended but imperfectly formed. In the fifth fail case Case5, when data are provided to each of the capacitors C2 and C4 through the second bit line BL2 or data of each of the capacitors C2 and C4 are provided to the second bit line BL2, a voltage level of data may not be transmitted normally due to the parasitic resistor. Accordingly, at least one of the second and fourth memory cells 1112 and 1114 may be recognized as a fail cell. The fifth fail case Case5 will be described in detail with reference to FIG. 4.

As illustrated in FIG. 3, in the first, fourth, and fifth fail cases Case1, Case4, and Case5, when the second and fourth memory cells 1112 and 1114 are respectively activated by the activate command ACT, the second and fourth memory cells 1112 and 1114 may affect each other through a parasitic resistor or a parasitic diode. That is, the second and fourth memory cells 1112 and 1114 share a common fail cause. However, the second and fourth memory cells 1112 and 1114 may have different data storage characteristics or different data transfer characteristics. For example, a line width of the first word line WL1 may be different from a line width of the second word line WL2, the transistor T2 may have a characteristic (e.g., a high threshold voltage or a great saturation current) better than the transistor T4, or the capacitor C2 may have a capacitance greater than that of the capacitor C4.

That is, the second and fourth memory cells 1112 and 1114 may have different characteristics due to the above-described reasons. Accordingly, for example, even though the second and fourth memory cells 1112 and 1114 share a common fail cause, the fourth memory cell 1114 may be determined as a fail cell, but the second memory cell 1112 may not be determined as a fail cell. However, since the second memory cell 1112 shares a fail cause with the fourth memory cell 1114, the second memory cell 1112 may cause a potential fail. In this case, the memory device 1000 according to an example embodiment outputs an address, which corresponds to the second memory cell 1112 causing a potential fail, as the virtual fail address ADD_vf through the virtual fail generator 1500. Alternatively, the second memory cell 1112 may be determined as a fail cell, but the fourth memory cell 1114 may not be determined as a fail cell, and the address which corresponds to the fourth memory cell 1114 may be output as the virtual fail address ADD_vf.

The memory device 1000 according to an example embodiment may also repair the second memory cell 1112 by using a spare memory cell. In the case where the memory device 1000 performs the column repair operation, the second bit line BL2 may be replaced with a bit line of the spare memory cell. Alternatively, in the case where the memory device 1000 performs the row repair operation, each of the first and second word lines WL1 and WL2 may be replaced with a word line of a spare memory cell.

As in the above description, in the second and third fail cases Case2 and Case3, when the third and fourth memory cells 1113 and 1114 are respectively activated, the third and fourth memory cells 1113 and 1114 may affect each other through a parasitic resistor or a parasitic diode. That is, the third and fourth memory cells 1113 and 1114 share a common fail cause. However, as described above, since the third and fourth memory cells 1113 and 1114 may have different characteristics due to various causes, and thus the fourth memory cell 1114 may be determined as a fail cell, but the third memory cell 1113 may not be determined as a fail cell. In this case, the memory device 1000 according to an example embodiment outputs an address, which corresponds to the third memory cell 1113 causing a potential fail, as the virtual fail address ADD_vf through the virtual fail generator 1500. The memory device 1000 according to an example embodiment may also repair the third memory cell 1113 by using a spare memory cell in the row repair or column repair method. Alternatively, the third memory cell 1113 may be determined as a fail cell, but the fourth memory cell 1114 may not be determined as a fail cell, and the address which corresponds to the fourth memory cell 1114 may be output as the virtual fail address ADD_vf.

Figure 4:
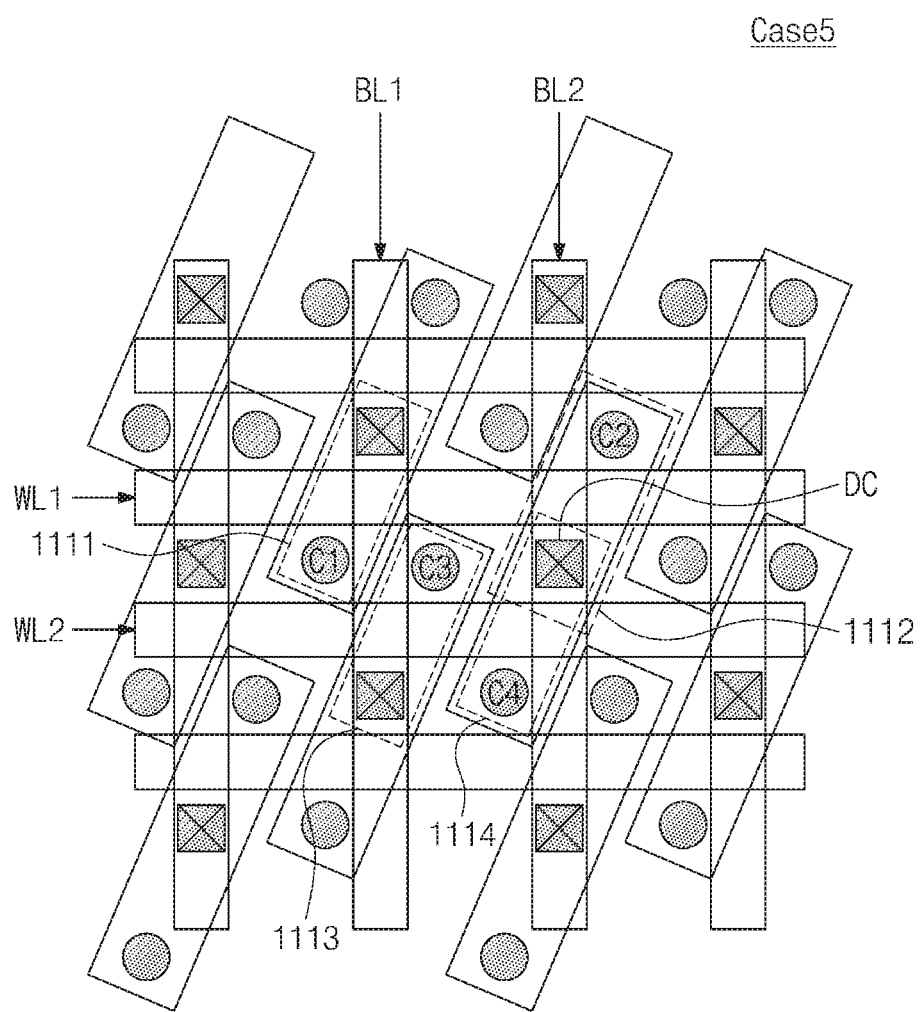
FIG. 4 is a plan view of the first to fourth memory cells for describing a fifth fail case illustrated in FIG. 3.

FIG. 4 is a plan view of the first to fourth memory cells for describing the fifth fail case illustrated in FIG. 3. The plan view of FIG. 4 will be described with reference to FIG. 3. The plan view of FIG. 4 may correspond to the circuit diagram of FIG. 3. Accordingly, configurations other than the second and fourth memory cells 1112 and 1114 associated with the fifth fail case Case5 are not described for ease of description.

A plan view of a memory cell formed in the form of a 6F square is illustrated in FIG. 4. The second and fourth memory cells 1112 and 1114 are connected with the second bit line BL2 through a direct contact DC. A gate of the transistor T2 included in the second memory cell 1112 is connected with the first word line WL1, a source thereof is connected with the direct contact DC, and a drain thereof is connected with the capacitor C2. A gate of the transistor T4 included in the fourth memory cell 1114 is connected with the second word line WL2, a source thereof is connected with the direct contact DC, and a drain thereof is connected with the capacitor C4.

As described above, the direct contact DC may not be formed as intended, due to a miniaturization manufacturing process. In the case where the direct contact DC is formed to be smaller than a target size, parasitic resistance due to the direct contact DC may increase. That is, an equivalent circuit is illustrated in FIG. 3 as a parasitic resistor shown in solid lines is added by the direct contact DC between the second bit line BL2 and the node n5. With the above description, the fifth fail case Case5 of FIG. 3 may occur due to a reason of the process described with reference to FIG. 4.

Figure 5:
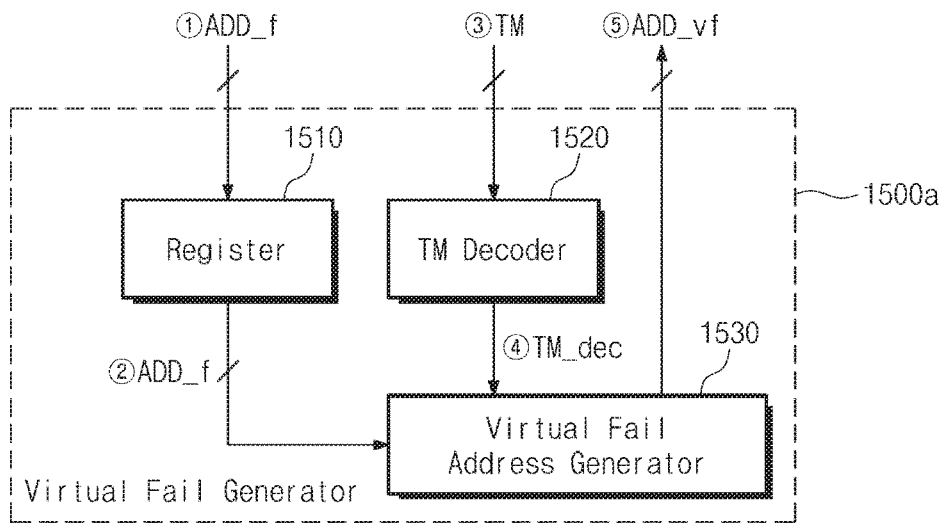
FIG. 5 is a block diagram illustrating a virtual fail generator according to an example embodiment.

FIG. 5 is a block diagram illustrating the virtual fail generator according to an example embodiment. FIG. 5 will be described with reference to FIG. 1. Referring to FIG. 5, a virtual fail generator 1500a may include a register 1510, a test mode signal (TM) decoder 1520, and a virtual fail address generator 1530.

The register 1510 stores the fail address ADD_f provided from the comparator 1410 of the peripheral circuit 1400 (①). Although not illustrated in FIG. 5, the register 1510 may be further provided with a command CMD. The register 1510 provides the fail address ADD_f to the virtual fail address generator 1530 based on the command CMD (②). For example, the register 1510 may be implemented with various storage media including a volatile storage element and/or a nonvolatile storage element.

The TM decoder 1520 is provided with the test mode signal TM from the outside of the memory device 1000 (③). For example, the test mode signal TM may be provided from an external test circuit. The test mode signal TM may be used to perform different functions based on fail cases. For example, the test mode signal TM may be used to increase or decrease a row address of the fail address ADD_f by "1". As another example, the test mode signal TM may be used to increase or decrease a column address of the fail address ADD_f by "1". Alternatively, the test mode signal TM may be used to change the fail address ADD_f into a complementary address. In addition, a change amount of the address changed by the test mode signal TM may be any value of "1" or more. In other words, the column or row address of the fail address ADD_f may be increased or decreased by 2 or more. The TM decoder 1520 decodes the test mode signal TM and provides the decoded test mode signal TM_dec to the virtual fail address generator 1530 (④).

The virtual fail address generator 1530 is provided with the fail address ADD_f and the decoded test mode signal TM_dec from the register 1510 and the TM decoder 1520, respectively. The virtual fail address generator 1530 generates the virtual fail address ADD_vf by changing the fail address ADD_f, in response to the decoded test mode signal TM_dec. The virtual fail address generator 1530 provides the generated virtual fail address ADD_vf to the peripheral circuit 1400. Afterwards, the fail address ADD_f and the virtual fail address ADD_vf may be output to the outside through a pad(s) of the peripheral circuit 1400 based on an external command.

Figure 6:
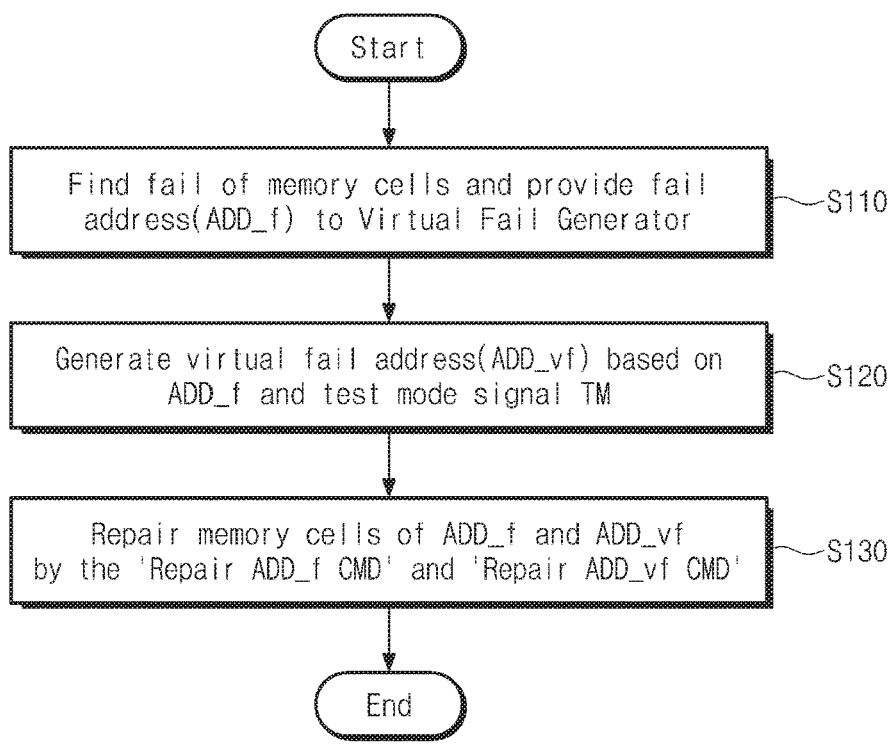
FIG. 6 is a flowchart illustrating a repair method of the memory device including the virtual fail generator of FIG. 5.

FIG. 6 is a flowchart illustrating a repair method of the memory device including the virtual fail generator of FIG. 5. The flowchart of FIG. 6 will be described with reference to FIGS. 1 and 5.

In operation S110, the comparator 1410 of the peripheral circuit 1400 determines whether a fail of a memory cell is generated and generates the fail address ADD_f of a fail cell. The comparator 1410 determines whether the fail of the memory cell is generated, by comparing test data output from the memory cell array 1100 with reference data. If it is determined that the fail of the memory cell is generated, the comparator 1410 provides the virtual fail generator 1500 with an address of the corresponding memory cell as the fail address ADD_f.

In operation S120, the virtual fail generator 1500 generates the virtual fail address ADD_vf based on the fail address ADD_f and the test mode signal TM. As described with reference to FIG. 1, the virtual fail generator 1500 is provided with the test mode signal TM for performing a different function based on a fail case of the memory cell. The virtual fail generator 1500 generates the virtual fail address ADD_vf based on the fail address ADD_f, in response to the test mode signal TM. The virtual fail generator 1500 outputs the generated virtual fail address ADD_vf to the outside through a pad or pads of the peripheral circuit 1400. In addition, the fail address ADD_f may be output to the outside together with the virtual fail address ADD_vf.

In operation S130, memory cells respectively corresponding to the fail address ADD_f and the virtual fail address ADD_vf are repaired according to a command provided from the outside. For example, the command may be provided from an external test circuit. Here, the command provided from the outside may include an "ADD_f repair command" to repair a memory cell corresponding to the fail address ADD_f and an "ADD_vf repair command" to repair a memory cell corresponding to the virtual fail address ADD_vf. In addition, the memory device 1000 is provided from the outside with the fail address ADD_f and the virtual fail address ADD_vf together with the corresponding to repair command. The memory device 1000 repairs memory cells corresponding to the provided addresses, based on the addresses and the repair command provided from the outside. With the above description, an actual fail cell and a memory cell having a potential fail cause may both be repaired.

Figure 7:
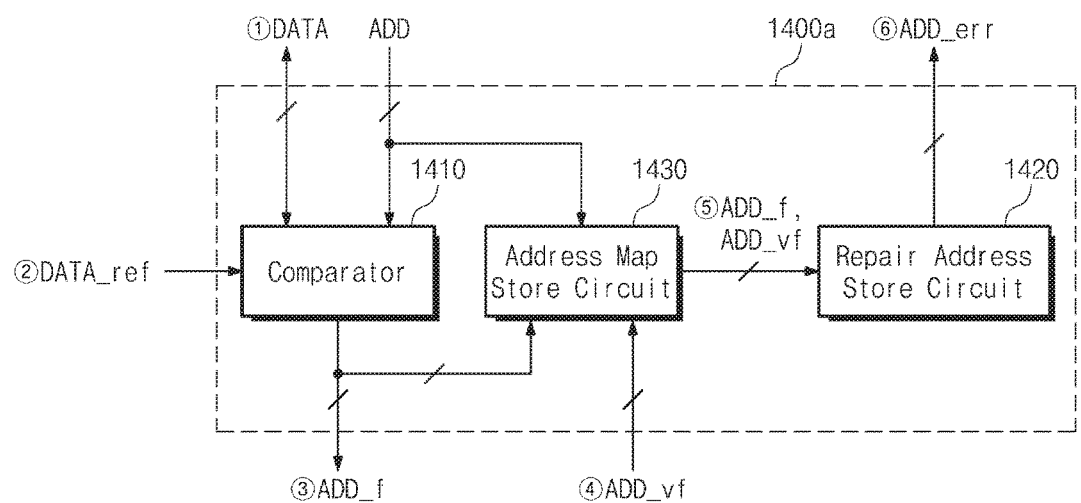
FIG. 7 is a block diagram illustrating a peripheral circuit, according to another example embodiment.

FIG. 7 is a block diagram illustrating the peripheral circuit, according to another example embodiment. The block diagram of FIG. 7 will be described with reference to FIG. 1. Referring to FIG. 7, a peripheral circuit 1400a may include a comparator 1410, a repair address store circuit 1420, and an address map store circuit 1430.

The comparator 1410 reads test data stored in a memory cell of the memory cell array 1100 (①). In some example embodiments, the comparator 1410 may read test data stored in each memory cell of the memory cell array 1100. The comparator 1410 is provided with reference data DATA_ref (②). For example, the reference data DATA_ref may be provided from the outside or from a storage device such as a mode register (not illustrated) of the memory device 1000. In the situation where the reference data DATA_ref is provided from the outside, the reference data DATA_ref may be provided, for example, from an external test circuit. The comparator 1410 determines whether a fail of the corresponding memory cell is generated, by comparing the read test data with the reference data DATA_ref. If the corresponding memory cell is a fail cell, the comparator 1410 provides an address of the fail cell to the virtual fail generator 1500 and the address map store circuit 1430 as the fail address ADD_f (③).

The address map store circuit 1430 maps the fail address ADD_f to the virtual fail address ADD_vf and stores mapping information. First, the address map store circuit 1430 is provided with the fail address ADD_f from the comparator 1410. The address map store circuit 1430 is also provided with the virtual fail address ADD_vf from the virtual fail generator 1500 (④). The address map store circuit 1430 maps the fail address ADD_f to the virtual fail address ADD_vf and stores mapping information.

Although not illustrated in FIG. 7, the address map store circuit 1430 may be further provided with a command. In a repair operation of the memory device 1000, the address map store circuit 1430 is provided from the outside with an address ADD corresponding to the fail cell and a repair command. For example, the address ADD and the repair command may be provided from an external test circuit. The address map store circuit 1430 searches for the fail address ADD_f matched with the address ADD corresponding to the fail cell and searches for the virtual fail address ADD_vf mapped onto the fail address ADD_f based on mapping information. The address map store circuit 1430 provides the found fail address ADD_f and the found virtual fail address ADD_vf to the repair address store circuit 1420 (⑤).

The repair address store circuit 1420 is provided with the fail address ADD_f and the virtual fail address ADD_vf from the address map store circuit 1430. The repair address store circuit 1420 records fail information of memory cells corresponding to the fail address ADD_f and the virtual fail address ADD_vf in a storage element (e.g., a fuse) in the repair address store circuit 1420. The repair address store circuit 1420 provides an error address ADD_err of the fail cell to the column decoder 1200 or the row decoder 1300 based on the recorded fail information (⑥).

Afterwards, the memory device 1000 may be provided with an activate command for a write operation or a read operation, and an address from the outside. For example, the activate command and the address may be provided from an external test circuit. When the corresponding address is matched with the error address ADD_err, the column decoder 1200 or the row decoder 1300 by-passes the matched corresponding address as an address of a spare memory cell. With the above description, the error address ADD_err is replaced with an address of a spare memory cell, thereby preventing an access to the error address ADD_err.

Figure 8:
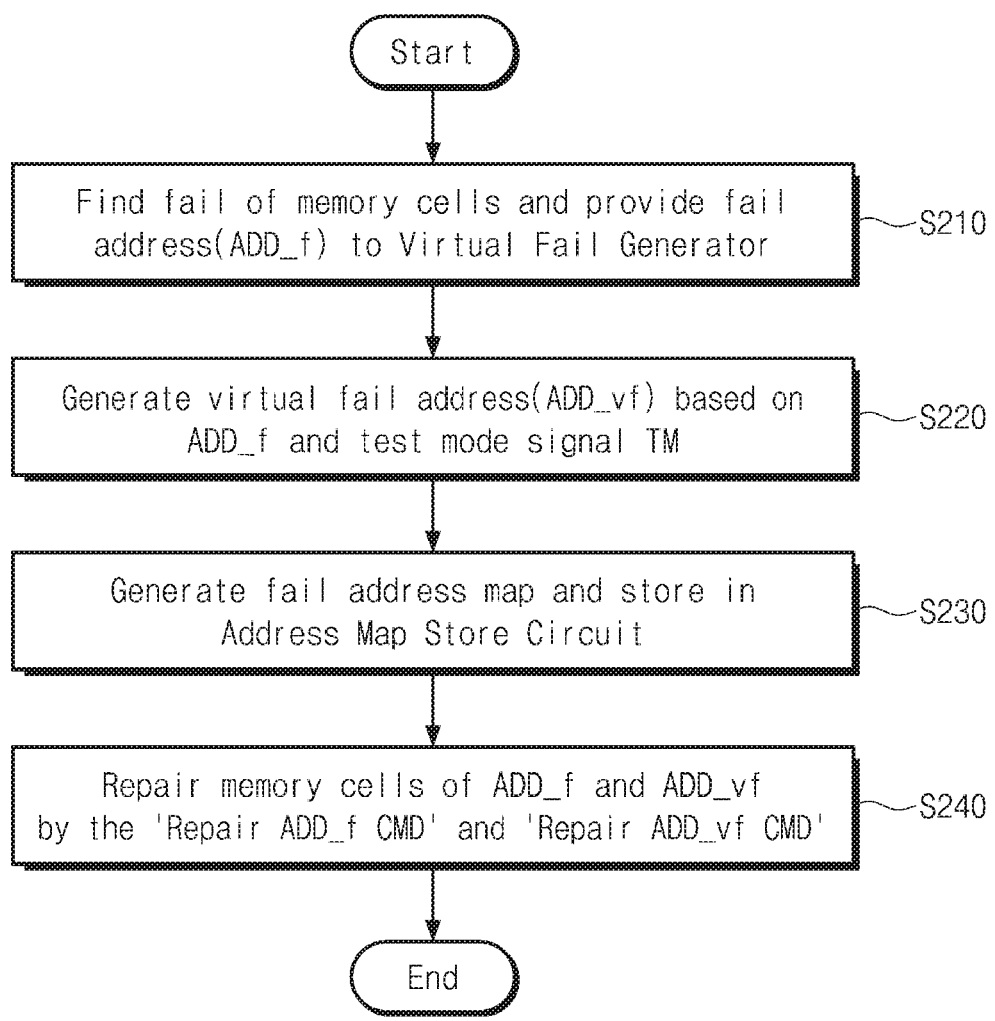
FIG. 8 is a flowchart illustrating a repair method of the memory device including the peripheral circuit of FIG. 7.

FIG. 8 is a flowchart illustrating a repair method of the memory device including the peripheral circuit of FIG. 7. The flowchart of FIG. 8 will be described with reference to FIGS. 1 and 7.

In operation S210, the comparator 1410 of the peripheral circuit 1400 determines whether a fail of a memory cell is generated and generates the fail address ADD_f of a fail cell. The generated fail address ADD_f is provided to the virtual fail generator 1500. Operation S210 is the same as operation S110 described with reference to FIG. 6. In operation S220, the virtual fail generator 1500 generates the virtual fail address ADD_vf based on the fail address ADD_f and the test mode signal TM. Operation S220 is the same as operation S120 described with reference to FIG. 6. However, the virtual fail address ADD_vf is provided to the address map store circuit 1430 of the peripheral circuit 1400a, not output to the outside. In operation S230, the address map store circuit 1430 maps the fail address ADD_f to the virtual fail address ADD_vf and stores mapping information.

In operation S240, memory cells respectively corresponding to the fail address ADD_f and the virtual fail address ADD_vf are repaired according to a command provided from the outside. For example, the command may be provided from an external test circuit. First, the address map store circuit 1430 is provided from the outside with an address ADD corresponding to the fail cell and a repair command. The address map store circuit 1430 searches for the fail address ADD_f matched with the address ADD corresponding to the fail cell and searches for the virtual fail address ADD_vf based on the mapping information. The address map store circuit 1430 provides the found fail address ADD_f and the found virtual fail address ADD_vf to the repair address store circuit 1420.

The repair address store circuit 1420 records fail information of the fail address ADD_f and the virtual fail address ADD_vf in a store element in the repair address store circuit 1420. The repair address store circuit 1420 provides the error address ADD_err to the column decoder 1200 or the row decoder 1300 based on the recorded fail information. With the above description, the memory device 1000 may repair memory cells corresponding to the fail address ADD_f and the virtual fail address ADD_vf in response to a command for repairing the memory cells.

Figure 9:
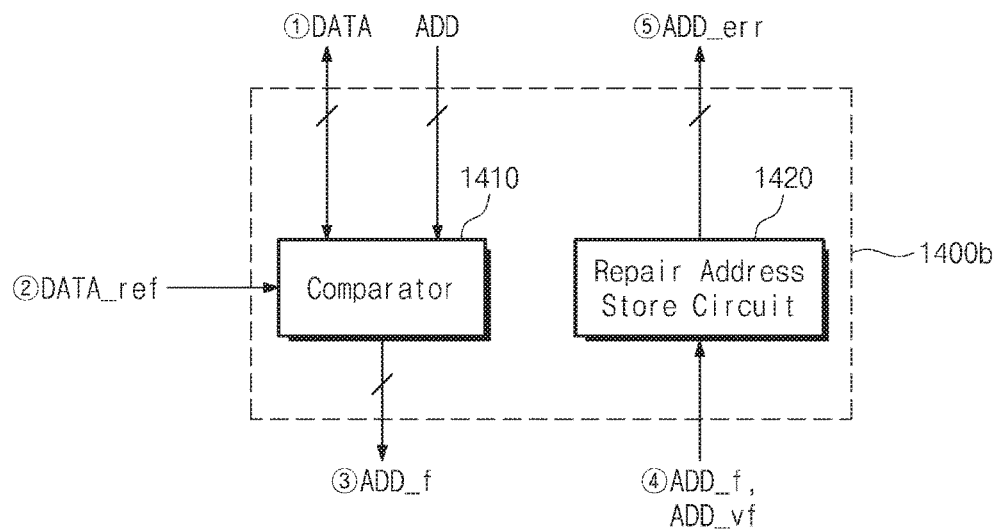
FIGS. 9 and 10 are block diagrams illustrating a peripheral circuit and a virtual fail generator, respectively, according to another example embodiment.
Figure 10:
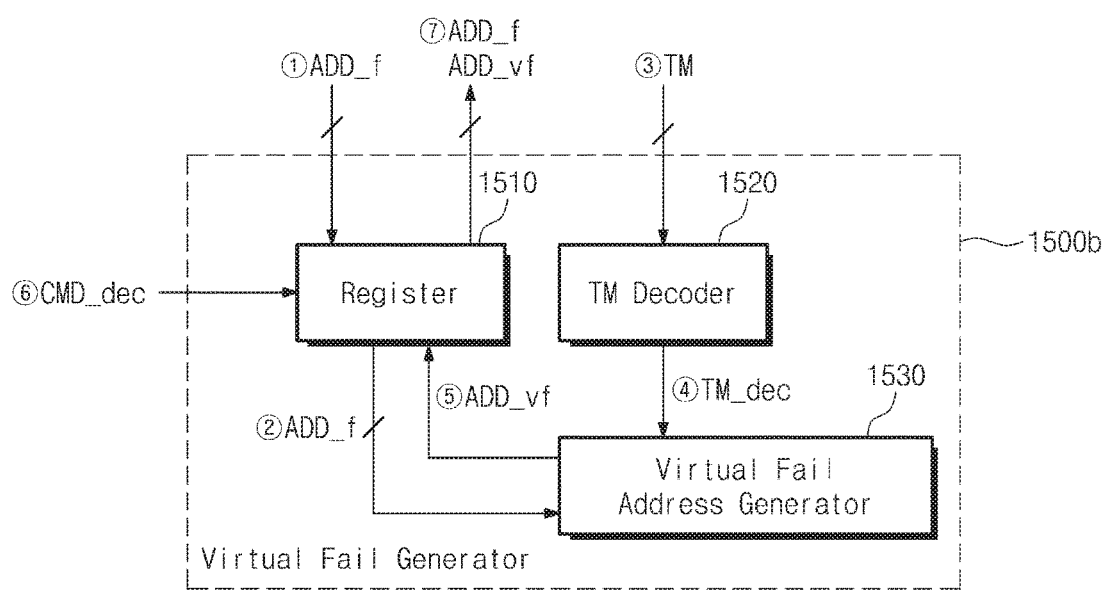

FIGS. 9 and 10 are block diagrams illustrating the peripheral circuit and the virtual fail generator, according to another example embodiment. The block diagrams of FIGS. 9 and 10 will be described with reference to FIG. 1.

Referring to FIG. 9, a peripheral circuit 1400b may include the comparator 1410 and the repair address store circuit 1420. Compared with the peripheral circuit 1400a of FIG. 7, the peripheral circuit 1400b may omit the address map store circuit 1430.

The comparator 1410 reads test data stored in a memory cell of the memory cell array 1100 (①). In some example embodiments, the comparator 1410 may read test data stored in each memory cell of the memory cell array 1100. The comparator 1410 is provided with the reference data DATA_ref (②). The comparator 1410 determines whether a fail of the corresponding memory cell is generated, by comparing the read test data with the reference data DATA_ref. If the corresponding memory cell is a fail cell, the comparator 1410 provides an address of the fail cell to a virtual fail generator 1500b as the fail address ADD_f (③).

The repair address store circuit 1420 is provided with the fail address ADD_f and the virtual fail address ADD_vf from the virtual fail generator 1500b (④). The repair address store circuit 1420 records fail information of the fail address ADD_f and the virtual fail address ADD_vf. The repair address store circuit 1420 provides the error address ADD_err to the column decoder 1200 or the row decoder 1300 based on the recorded fail information (⑤). The repair address store circuit 1420 of FIG. 9 performs a function similar to that of the repair address store circuit 1420 of FIG. 7 except the repair address store circuit 1420 of FIG. 9 is provided with both the fail address ADD_f and the virtual fail address ADD_vf from the virtual fail generator 1500b, rather than receiving only the virtual fail address ADD_vf from the address map store circuit 1430. Thus, a detailed description of the repair address store circuit 1420 is omitted.

Referring to FIG. 10, the virtual fail generator 1500b may include the register 1510, the TM decoder 1520, and the virtual fail address generator 1530. The register 1510 stores the fail address ADD_f provided from the comparator 1410 of the peripheral circuit 1400 (①). The register 1510 provides the fail address ADD_f to the virtual fail address generator 1530 (②).

The TM decoder 1520 is provided with the test mode signal TM from the outside of the memory device 1000 (③). For example, the test mode signal TM may be provided from an external test circuit. The TM decoder 1520 decodes the test mode signal TM and provides the decoded test mode signal TM_dec to the virtual fail address generator 1530 (④). A function of the TM decoder 1520 is the same as that described with reference to FIG. 5. Thus, a detailed description of the TM decoder 1520 is omitted.

The virtual fail address generator 1530 is provided with the fail address ADD_f and the decoded test mode signal TM_dec from the register 1510 and the TM decoder 1520, respectively. The virtual fail address generator 1530 generates the virtual fail address ADD_vf by changing the fail address ADD_f, in response to the decoded test mode signal TM_dec. The virtual fail address generator 1530 provides the generated virtual fail address ADD_vf to the register 1510 (⑤).

In a repair operation of the memory device 1000, the register 1510 is provided with a decoding command CMD_dec decoded by a command decoder (not illustrated) of the peripheral circuit 1400b (⑥). For example, the decoding command CMD_dec may include a repair command. The register 1510 provides the fail address ADD_f and the virtual fail address ADD_vf to the repair address store circuit 1420 based on the decoding command CMD_dec (⑦). The provided fail address ADD_f and the provided virtual fail address ADD_vf are recorded in the repair address store circuit 1420 through the repair operation.

Compared with the virtual fail address generator 1530 of FIG. 5, the virtual fail address generator 1530 of FIG. 10 provides the virtual fail address ADD_vf to the register 1510 without outputting the virtual fail address ADD_vf to the outside through the peripheral circuit 1400b. Also, the register 1510 provides the stored fail address ADD_f and the stored virtual fail address ADD_vf to the peripheral circuit 1400b in response to the repair command. That is, the memory device 1000 that includes the peripheral circuit 1400b of FIG. 9 and the virtual fail generator 1500b of FIG. 10 may perform a repair operation in response to only a repair command, without an address for repair.

Figure 11:
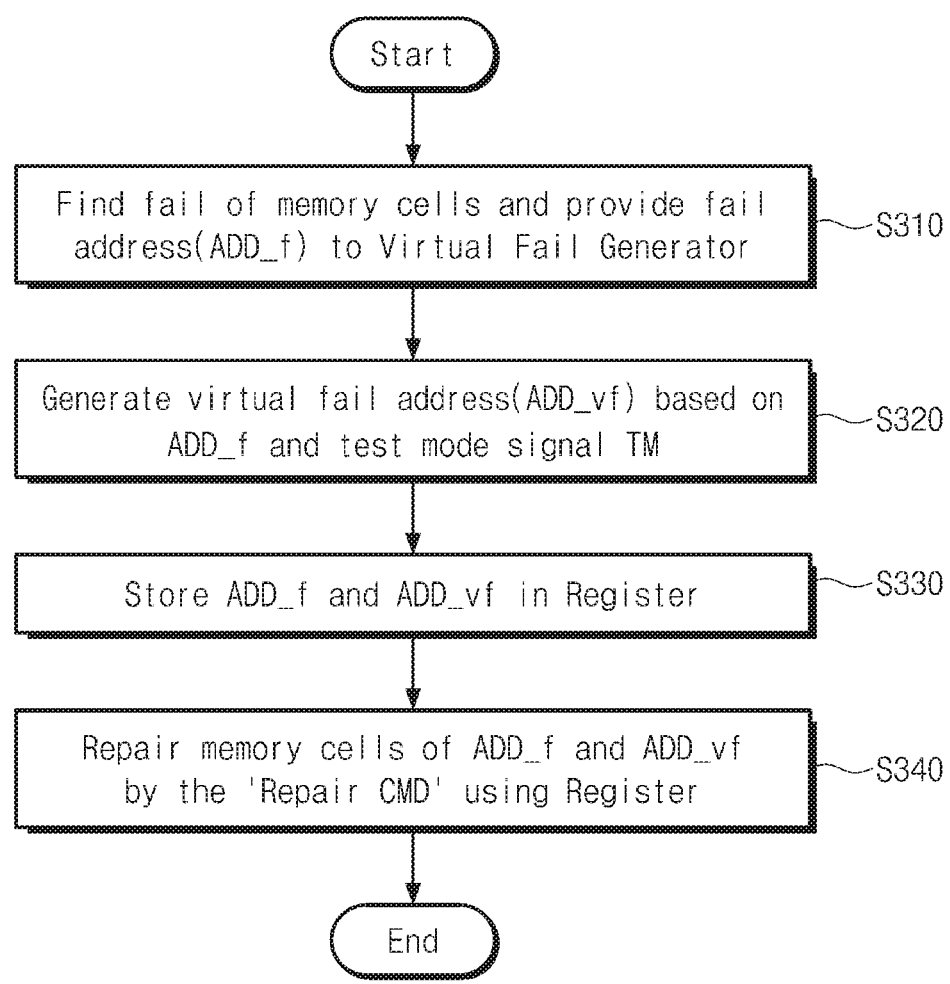
FIG. 11 is a flowchart illustrating a repair method of the memory device including the peripheral circuit of FIG. 9 and the virtual fail generator of FIG. 10.

FIG. 11 is a flowchart illustrating a repair method of the memory device including the peripheral circuit of FIG. 9 and the virtual fail generator of FIG. 10. FIG. 11 will be described with reference to FIGS. 1, 9, and 10.

In operation S310, the comparator 1410 of the peripheral circuit 1400 determines whether a fail of a memory cell is generated and provides the fail address ADD_f of a fail cell to the virtual fail generator 1500b. The register 1510 of the virtual fail generator 1500b stores the fail address ADD_f. Operation S310 is the same as operation S110 described with reference to FIG. 6. In operation S320, the virtual fail generator 1500b generates the virtual fail address ADD_vf based on the fail address ADD_f and the test mode signal TM. Operation S320 is the same as operation S120 described with reference to FIG. 6. However, the generated fail address ADD_f is provided to the register 1510. In operation S330, the register 1510 stores the virtual fail address ADD_vf.

In operation S340, memory cells respectively corresponding to the fail address ADD_f and the virtual fail address ADD_vf are repaired according to a command provided from the outside. For example, the command may be provided from an external test circuit. First, the memory device 1000 is provided with a repair command from the outside, and a command decoder (not illustrated) decodes the repair command. The register 1510 of the virtual fail generator 1500b provides the stored fail address ADD_f and the stored virtual fail address ADD_vf to the repair address store circuit 1420 in response to the decoded repair command.

The repair address store circuit 1420 records fail information of the fail address ADD_f and the virtual fail address ADD_vf in a storage element in the repair address store circuit 1420. The repair address store circuit 1420 provides the error address ADD_err to the column decoder 1200 or the row decoder 1300 based on the recorded fail information. In response to the repair command, the memory device 1000 may read the fail address ADD_f and the virtual fail address ADD_vf from the register 1510 and may repair memory cells corresponding to the addresses ADD_f and ADD_vf.

Figure 12:
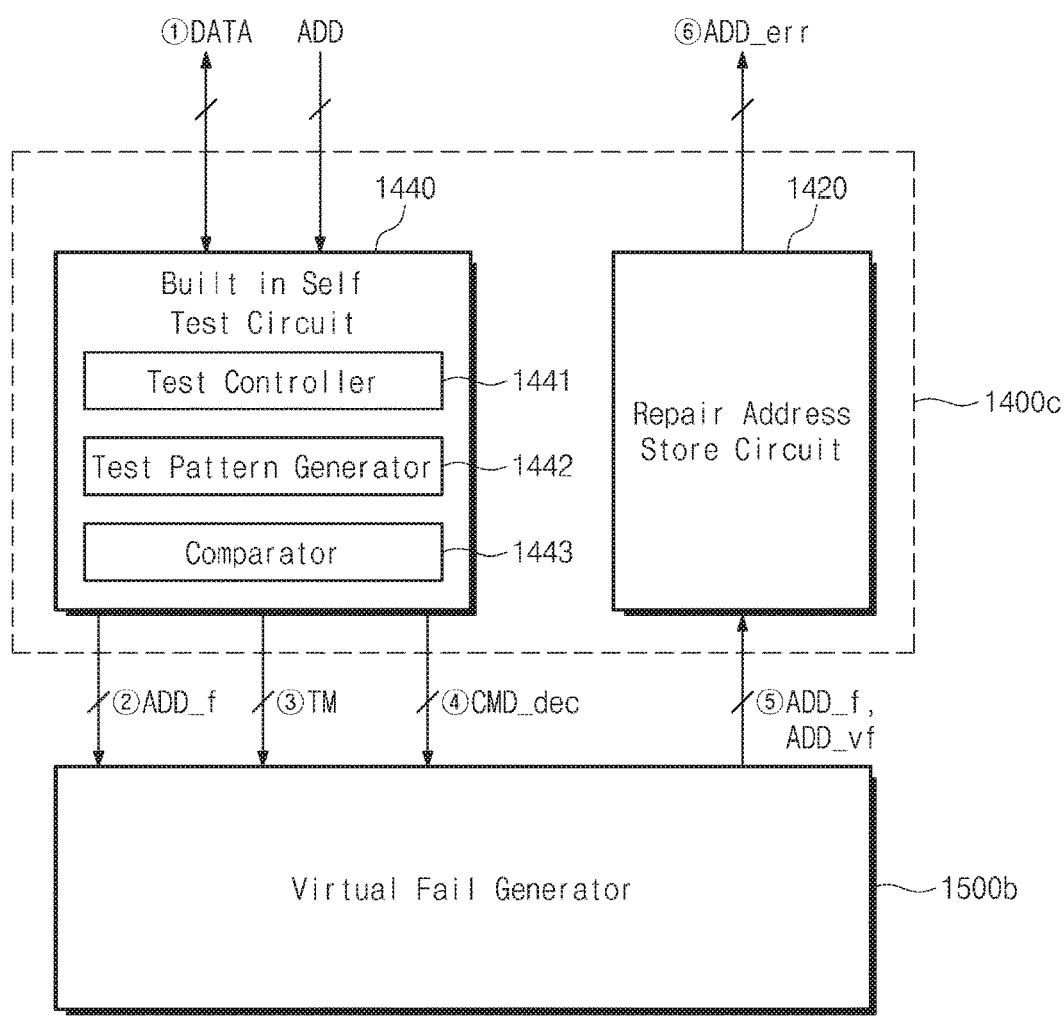
FIG. 12 is a block diagram illustrating a peripheral circuit and a virtual fail generator, according to another example embodiment.

FIG. 12 is a block diagram illustrating the peripheral circuit and the virtual fail generator, according to another example embodiment. The block diagram of FIG. 12 will be described with reference to FIG. 1. Referring to FIG. 12, a peripheral circuit 1400c may include the repair address store circuit 1420 and a built in self-test (BIST) circuit 1440. A configuration and an operation of the repair address store circuit 1420 are the same as those described with reference to FIG. 9. Thus, a detailed description of the repair address store circuit 1420 is omitted. The peripheral circuit 1400c may be connected to communicate with the virtual fail generator 1500b illustrated in FIG. 10.

The BIST circuit 1440 is a logic circuit that is integrated in a chip together with an internal circuit of the chip to test whether the internal circuit of the chip operates normally. In the case where the BIST circuit 1440 is embedded in the chip, a procedure for testing the logic circuit of the chip may be simplified, and an optimized test operation may be performed for each module of the chip. Also, since an external test apparatus is not used upon testing the chip, test time and costs may be reduced.

The BIST circuit 1440 may include a test controller 1441, a test pattern generator 1442, and a comparator 1443. The test controller 1441 controls operations of the test pattern generator 1442 and the comparator 1443. The test controller 1441 may determine fail cases of fail cells by analyzing fail addresses of memory cells determined by the comparator 1443 based on a test pattern. The test pattern generator 1442 generates the test pattern under control of the test controller 1441. The test pattern generator 1442 provides the generated test pattern to a memory cell of the memory cell array 1100.

The comparator 1443 of the BIST circuit 1440 reads the test pattern from the memory cells (①). The comparator 1443 determines whether a fail of the corresponding memory cell is generated, by comparing the read test data with reference data. The comparator 1443 generates the fail address ADD_f of a fail cell based on the determination result. The generated fail address ADD_f is provided to the virtual fail generator 1500b (②). Next, the test controller 1441 provides the virtual fail generator 1500b with the test mode signal TM for generating the virtual fail address ADD_vf based on the analyzed fail case of the fail cell (③).

As described with reference to FIG. 10, the virtual fail generator 1500b generates the virtual fail address ADD_vf based on the fail address ADD_f, in response to the test mode signal TM. The virtual fail generator 1500b is provided with the decoding command CMD_dec from the BIST circuit 1440 (④). In response to the decoding command CMD_dec, the virtual fail generator 1500b generates the virtual fail address ADD_vf.

Next, the repair address store circuit 1420 is provided with the fail address ADD_f and the virtual fail address ADD_vf from the virtual fail generator 1500b (⑤). The repair address store circuit 1420 records fail information based on the provided fail address ADD_f and the provided virtual fail address ADD_vf. The repair address store circuit 1420 provides the error address ADD_err to the column decoder 1200 or the row decoder 1300 based on the recorded fail information (⑥) With the above description, the memory device 1000 may repair a fail cell and a memory cell having a potential fail cause without an external control.

Figure 13:
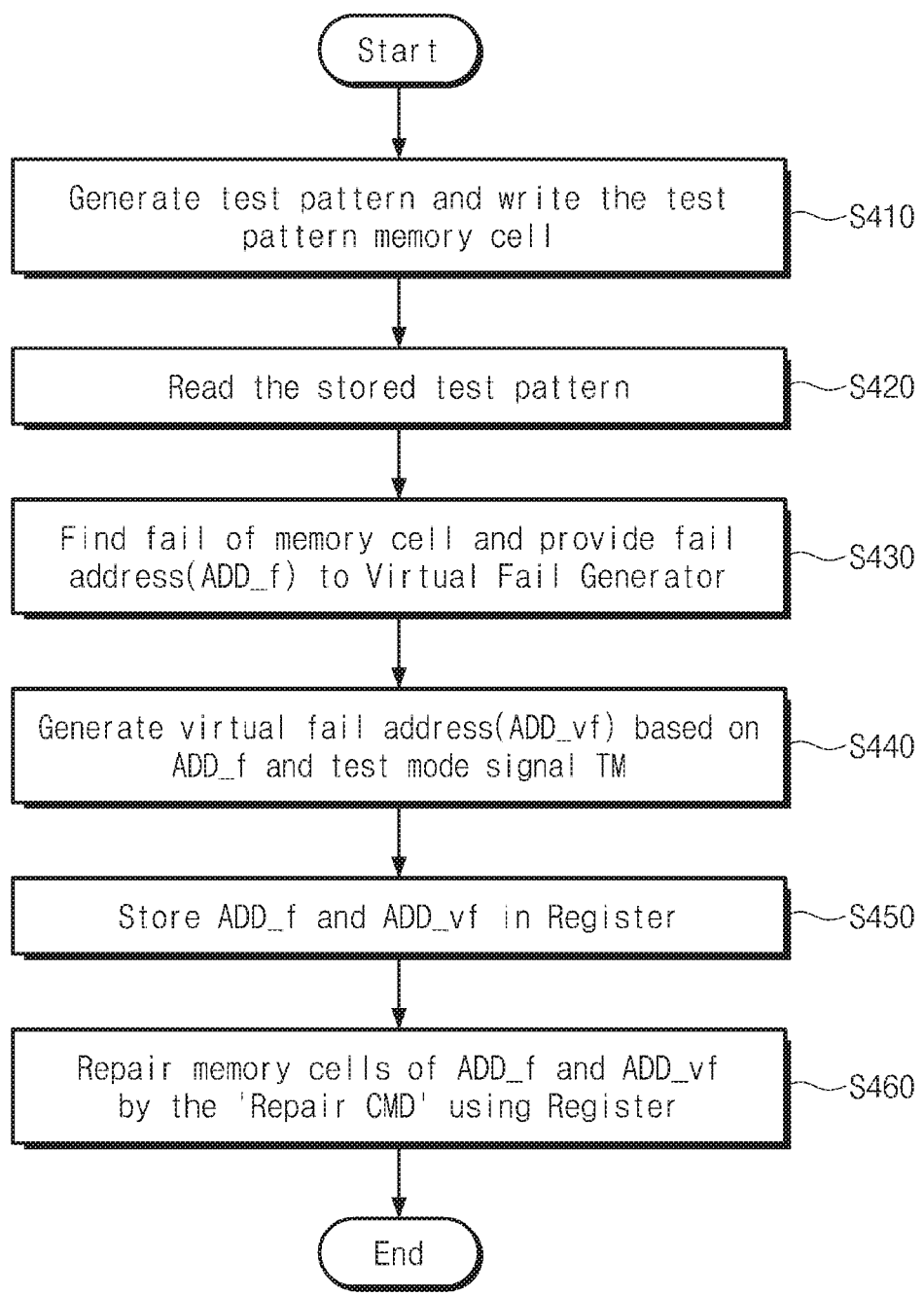
FIG. 13 is a flowchart illustrating a repair method of the memory device including the peripheral circuit of FIG. 12.

FIG. 13 is a flowchart illustrating a repair method of the memory device including the peripheral circuit of FIG. 12. FIG. 13 will be described with reference to FIGS. 1 and 12.

In operation S410, the test pattern generator 1442 of the BIST circuit 1440 generates a test pattern under control of the test controller 1441. The test pattern generator 1442 writes the generated test pattern in a memory cell of the memory cell array 1100. In operation S420, the comparator 1443 of the BIST circuit 1440 reads the test pattern from the memory cell. In operation S430, the comparator 1443 determines whether a fail of the memory cell is generated and generates the fail address ADD_f of a fail cell. The generated fail address ADD_f is provided to the virtual fail generator 1500b. The register 1510 of the virtual fail generator 1500b stores the fail address ADD_f. Operation S430 is the same as operation S110 described with reference to FIG. 6.

In operation S440, the virtual fail generator 1500b generates the virtual fail address ADD_vf based on the fail address ADD_f and the test mode signal TM provided from the BIST circuit 1440. Operation S440 is the same as operation S320 described with reference to FIG. 8. In operation S450, the register 1510 stores the virtual fail address ADD_vf. Operation S450 is the same as operation S330 described with reference to FIG. 8.

In operation S460, memory cells respectively corresponding to the fail address ADD_f and the virtual fail address ADD_vf are repaired under control of the BIST circuit 1440. First, the BIST circuit 1440 provides the virtual fail generator 1500b with a repair command for performing a repair operation. The register 1510 of the virtual fail generator 1500b provides the fail address ADD_f and the virtual fail address ADD_vf to the repair address store circuit 1420 in response to the repair command.

The repair address store circuit 1420 records fail information of memory cells corresponding to the fail address ADD_f and the virtual fail address ADD_vf. The repair address store circuit 1420 provides the error address ADD_err to the column decoder 1200 or the row decoder 1300 based on the recorded fail information. That is, the memory device 1000 reads the fail address ADD_f and the virtual fail address ADD_vf from the register 1510 by using a command provided from the BIST circuit 1440. With the above description, the memory device 1000 may repair memory cells corresponding to the addresses ADD_f and ADD of without an external control.

Figure 14:
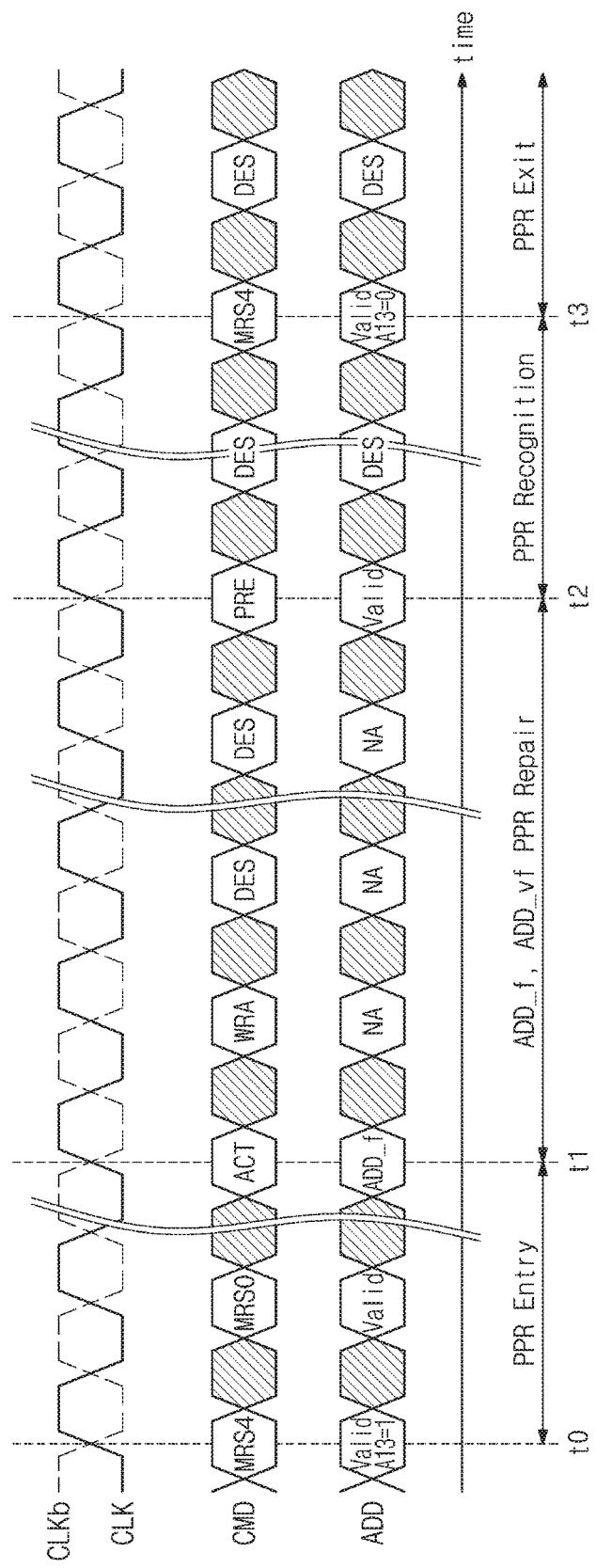
FIG. 14 is a signal diagram illustrating signals that the memory device of FIG. 1 receives from a host to perform a repair operation.

FIG. 14 is a signal diagram illustrating signals that the memory device of FIG. 1 receives from a host to perform a repair operation. FIG. 14 will be described with reference to FIG. 1.

Signals that the memory device 1000 receives from a host (not illustrated) to perform a repair operation based on post package repair (PPR) are illustrated in FIG. 14. For ease of description, patterns of signals such as DQ and DQS are not illustrated. The signal diagram of FIG. 14 may be easily understood with reference to the Joint Electron Device Engineering Council (JEDEC) standard specification of a double data rate 4 dynamic random access memory (DDR4 DRAM).

At a time point t0, the memory device 1000 is provided with an Mode Register Set 4 (MRS4) signal from the host (not illustrated). Also, the memory device 1000 receives logic "1" through an address pad A13. Next, the memory device 1000 is provided with an MRSO signal. The memory device 1000 enters a PPR mode in response to the received signals.

At a time point t1, the memory device 1000 is provided with the activate command ACT and the fail address ADD_f from the host (not illustrated). Next, the memory device 1000 receives a WRAcommand. During the PPR-based repair operation, the memory device 1000 fails to receive a refresh command from the host (not illustrated). Accordingly, the memory device 1000 performs an auto refresh operation in response to the WRA command.

In a time interval from t1 to t2, the memory device 1000 performs the PPR-based repair operation. For example, the memory device 1000 according to the example embodiment of FIGS. 5 and 6 performs the repair operation on a memory cell corresponding to the fail address ADD_f. Alternatively, the memory device 1000 according to the example embodiment of FIGS. 7 and 8 or the memory device 1000 according to the example embodiment of FIGS. 9 to 11 performs the repair operation on memory cells corresponding to the fail address ADD_f and the virtual fail address ADD_vf.

At a time point t2, the memory device 1000 receives a pre-charge command PRE from the host (not illustrated). In a time interval from t2 to t3, the memory device 1000 recognizes addresses of the repaired memory cells. At a time point t3, the memory device 1000 is provided with the MRS4 signal from the host (not illustrated). Also, the memory device 1000 receives logic "0" through the address pad A13. The memory device 1000 exits from the PPR mode in response to the received signals.

Figure 15:
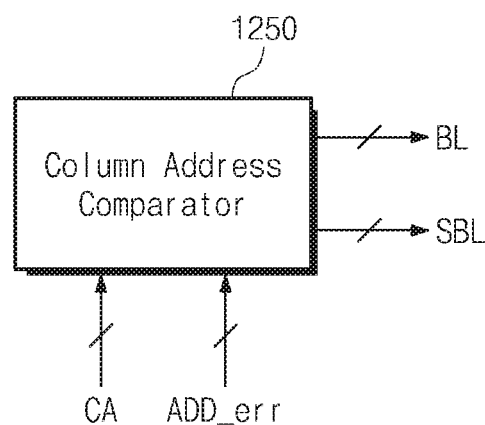
FIG. 15 is a block diagram illustrating a column address comparator for performing column repair.

FIG. 15 is a block diagram illustrating the column address comparator for performing column repair. FIG. 15 will be described with reference to FIG. 1. In the case where the memory device 1000 performs the column repair, a column address comparator 1250 may be included in the column decoder 1200. The column decoder 1200 may be denoted as a repair circuit.

To perform a write or read operation, the memory device 1000 is provided with the activate command ACT and column address CA from the host (not illustrated). In this case, the column address comparator 1250 is provided with the column address CA and the error address ADD_err from the peripheral circuit 1400. When the column address CA is not matched with the error address ADD_err, the column address comparator 1250 activates a bit line BL corresponding to the column address CA. In contrast, when the column address CA is matched with the error address ADD_err, the column address comparator 1250 activates a spare bit line SBL replacing the error address ADD_err. With the above description, it may be possible to prevent an access to the error address ADD_err.

Figure 16:
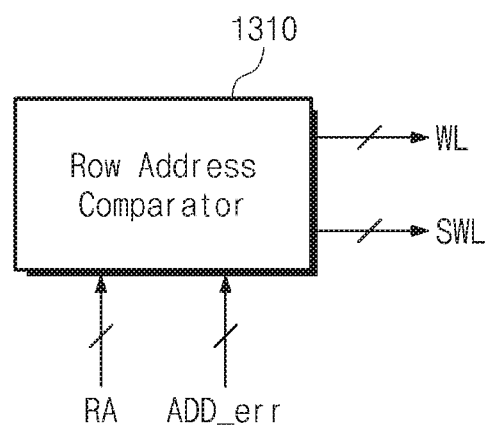
FIG. 16 is a block diagram illustrating a row address comparator for performing row repair.

FIG. 16 is a block diagram illustrating the row address comparator for performing row repair. FIG. 16 will be described with reference to FIG. 1. In the case where the memory device 1000 performs the row repair, a row address comparator 1310 may be included in the row decoder 1300. The row decoder 1300 may form a repair circuit. Although a spare word line SWL is not illustrated in FIG. 1, the memory device 1000 that performs the row repair may include the spare word line SWL.

To perform a write or read operation, the memory device 1000 is provided with the activate command ACT and row address RA from the host (not illustrated). In this case, the row address comparator 1310 is provided with the row address RA and the error address ADD_err from the peripheral circuit 1400. When the row address RA is not matched with the error address ADD_err, the row address comparator 1310 activates a word line WL corresponding to the row address RA. In contrast, when the row address RA is matched with the error address ADD_err, the row address comparator 1310 activates a spare word line SWL replacing the error address ADD_err. With the above description, it may be possible to prevent an access to the error address ADD_err. The column decoder 1200 and/or the row decoder 1300 may form the repair circuit depending on whether a column or row or both is to be repaired.

Figure 17:
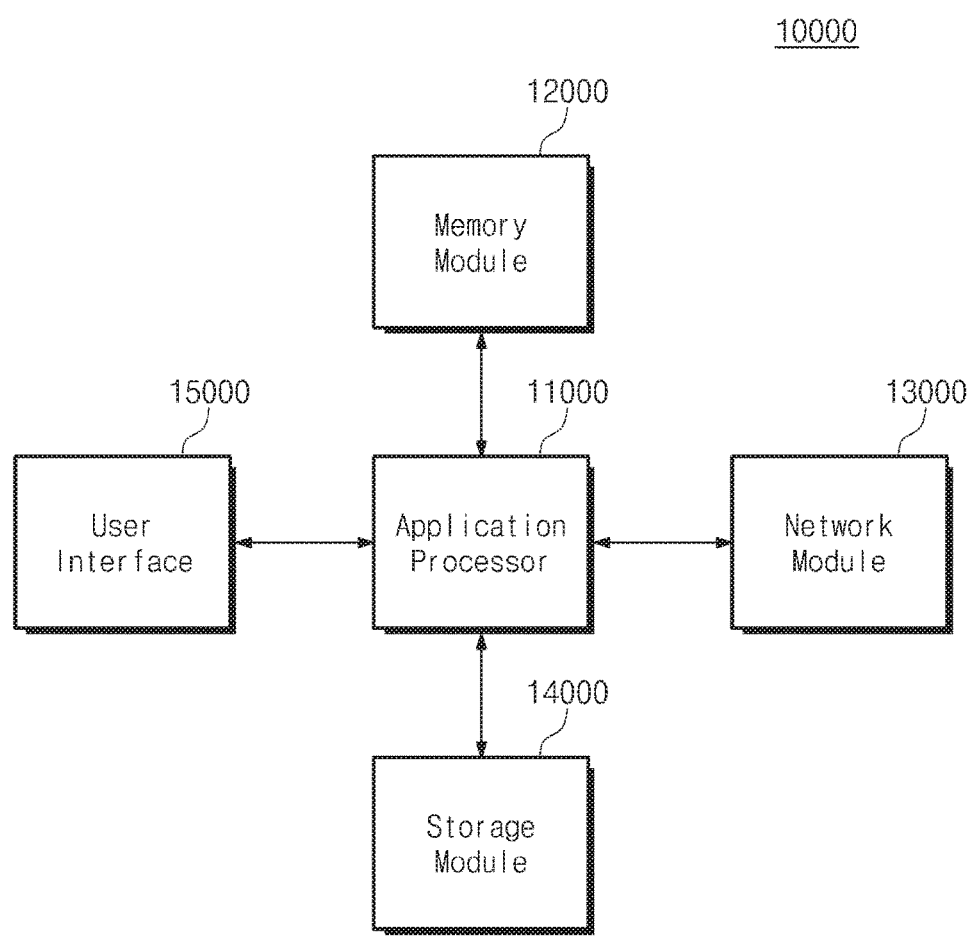
FIG. 17 is a block diagram illustrating a user system to which a memory device according to an example embodiment is applied.

FIG. 17 is a block diagram illustrating a user system to which a memory device according to an example embodiment is applied. Referring to FIG. 17, a user system 10000 may include an application processor 11000, a memory module 12000, a network module 13000, a storage module 14000, and a user interface 15000.

The application processor 11000 may drive elements and an operating system that are included in the user system 10000. For example, the application processor 11000 may include controllers for controlling elements of the user system 10000, interfaces, graphics engines, etc. The application processor 11000 may be implemented with a system-on-chip (SoC). The application processor 11000 may be a microprocessor.

The memory module 12000 may operate as a main memory, a working memory, a buffer memory, or a cache memory of the user system 10000. The memory module 12000 may be implemented with a volatile random access memory, such as a DRAM, an SDRAM, a double date rate (DDR) SDRAM, a DDR2 SDRAM, a DDR3 SDRAM, an LPDDR SDRAM, an LPDDR2 SDRAM, a low power DDR3 (LPDDR3) SDRAM, or HBM or a nonvolatile random access memory, such as a phase-change RAM (PRAM), a magnetic RAM (MRAM), a resistive RAM (RRAM), or a ferroelectric RAM (FRAM). The memory module 12000 may include the memory device 1000 illustrated in FIG. 1. That is, the memory module 12000 may be implemented to include the memory device 1000 including the virtual fail generator 1500 described with reference to FIGS. 1 to 16.

The network module 13000 may communicate with external devices. For example, the network module 13000 may support wireless communications, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, and Wi-Fi. Here, the network module 13000 may be included in the application processor 11000.

The storage module 14000 may store data. For example, the storage module 14000 may store data received from the application processor 11000. Alternatively, the storage module 14000 may transmit data stored therein to the application processor 11000. For example, the storage module 14000 may be implemented with a semiconductor memory device such as a PRAM, an MRAM, a RRAM, a NAND flash memory, a NOR flash memory, or a three-dimensional NAND flash memory.

The user interface 15000 may include interfaces which input data or a command to the application processor 11000 or output data to an external device. For example, the user interface 15000 may include user input interfaces such as a keyboard, a keypad, a button, a touch panel, a touch screen, a touch pad, a touch ball, a camera, a microphone, a gyroscope sensor, a vibration sensor, and/or a piezoelectric element. The user interface 15000 may further include user output interfaces such as a liquid crystal display (LCD), an organic light-emitting diode (OLED) display device, an active matrix OLED (AMOLED) display device, a light-emitting diode (LED), a speaker, and/or a motor.

A memory device including a virtual fail generator according to an example embodiment and a memory cell repair method thereof may repair a memory cell causing a potential fail. Accordingly, the reliability of the memory device may be improved by reducing the frequency of occurrence of a fail cell during an operation of the memory device.

While example embodiments been described, it will be apparent to those skilled in the art that various changes and modifications may be made without departing from the spirit and scope thereof. Therefore, it should be understood that the above example embodiments are not limiting, but illustrative.

What is claimed is:

1. A memory device comprising:
a memory cell array comprising memory cells;
a comparator configured to determine whether a fail of a first memory cell from among the memory cells is generated, by comparing data stored in the first memory cell with an expected value, the first memory cell corresponding to a first address; and
a virtual fail generator configured to, in response to the comparator determining that the fail of the first memory cell is generated, generate a second address based on the first address provided from the comparator,
wherein the memory device is configured to repair the first memory cell and a second memory cell from among the memory cells using spare memory cells from among the memory cells in response to a repair command, the second memory cell corresponding to the second address.

2. The memory device of claim 1, wherein a row address of the second address is the same as a row address of the first address, and
wherein a column address of the second address is one of column addresses adjacent to a column address of the first address.

3. The memory device of claim 1, wherein a column address of the second address is the same as a column address of the first address, and
wherein a row address of the second address is one of row addresses adjacent to a row address of the first address.

4. The memory device of claim 1, wherein the first address and the second address are output to a host connected with the memory device,
wherein the first memory cell and the second memory cell are repaired when the first address, the second address, a first repair command for repairing the first memory cell, and a second repair command for repairing the second memory cell are received from the host, and
wherein the repair command comprises the first repair command and the second repair command.

5. The memory device of claim 1, further comprising:
an address map store circuit configured to store mapping information generated by mapping the first address to the second address.

6. The memory device of claim 5, wherein the first address is output to a host connected with the memory device, and
wherein the first memory cell and the second memory cell are repaired with reference to the mapping information when the first address and a repair command for repairing the first memory cell are received from the host.

7. The memory device of claim 1, wherein the virtual fail generator comprises:
a register configured to store the first address provided from the comparator; and
a virtual fail address generator configured to generate the second address based on the first address.

8. The memory device of claim 7, wherein the virtual fail generator further comprises:
a decoder configured to receive, from a host, a control signal for deciding the second address, to decode the control signal, and to provide a decoded control signal to the virtual fail address generator,
wherein the virtual fail address generator is further configured to generate the second address based on the first address and the decoded control signal.

9. The memory device of claim 7, wherein the register is further configured to store the second address provided from the virtual fail address generator.

10. The memory device of claim 9, wherein the first memory cell and the second memory cell are repaired with reference to the first address and the second address, respectively, that are stored in the register, when the repair command is received from a host.

11. The memory device of claim 1, wherein the first memory cell and the second memory cell are repaired by performing at least one of a row repair to repair a row address including a row address of each of the first address and the second address and a column repair to repair a column address including a column address of each of the first address and second address.

12. A memory cell repair method of a memory device including a memory cell array, the memory cell repair method comprising:
reading data for verifying whether fails of memory cells included in the memory cell array are generated, from a first memory cell of the memory cells, the first memory cell corresponding to a first address;
determining, at a comparator of the memory device, whether a fail of the first memory cell is generated, by comparing the data that is read with an expected value; and
generating, at a virtual fail generator of the memory device in response to determining that the fail of the first memory cell is generated, a second address which is based on the first address provided from the comparator.

13. The memory cell repair method of claim 12, further comprising:
repairing the first memory cell and a second memory cell from among the memory cells by using spare memory cells from among the memory cells, the second memory cell corresponding to the second address.

14. The memory cell repair method of claim 13, wherein the repairing the first memory cell and the second memory cell comprises:
receiving, at the memory device, the first address, the second address, a first repair command for repairing the first memory cell, and a second repair command for repairing the second memory cell from a host; and
repairing the first memory cell and the second memory cell with reference to the first address and the second address, respectively, in response to the first repair command and the second repair command.

15. The memory cell repair method of claim 13, wherein the repairing the first memory cell and the second memory cell comprises:
repairing the first memory cell and the second memory cell with reference to the first address and the second address, respectively, that are stored in a register of the memory device, in response to a repair command received from a host.

16. The memory cell repair method of claim 12, further comprising:
storing, at an address map store circuit of the memory device, mapping information generated by mapping the first address to the second address.

17. The memory cell repair method of claim 16, further comprising:
receiving, at the memory device, a first repair command and the first address from a host; and repairing the first memory cell and the second memory cell with reference to the first address and the mapping information, in response to the first repair command.

18. A memory device comprising:

a memory cell array comprising memory cells;

a comparator configured to determine whether a fail of a first memory cell from among the memory cells is generated, by comparing data stored in the first memory cell with an expected value, the first memory cell corresponding to a first address;

a virtual fail generator configured to generate a second address based on the first address provided from the comparator, in response to the comparator determining that the fail of the first memory cell is generated; and a fail address store circuit comprising fuse sets for storing the first address and the second address, wherein the first memory cell stored in the fail address store circuit and a second memory cell corresponding to the second address stored in the fail address store circuit are repaired by spare memory cells.

19. The memory device of claim 18, further comprising:

a row decoder configured to drive a word line of the memory cell array and to repair a row address of the first address and a row address of the second address.

20. The memory device of claim 18, further comprising:

a column decoder configured to drive a bit line of the memory cell array and to repair a column address of the first address and a column address of the second address.

* * * * *